United States Patent
Liu et al.

(10) Patent No.: US 10,699,765 B2
(45) Date of Patent: Jun. 30, 2020

(54) METHODS AND CIRCUITS FOR PROGRAMMING STT-MRAM CELLS FOR REDUCING BACK-HOPPING

(71) Applicant: Taiwan Semiconductor Manufacturing Company, Ltd., Hsinchu (TW)

(72) Inventors: Huanlong Liu, Sunnyvale, CA (US); Guenole Jan, San Jose, CA (US); Yuan-Jen Lee, Fremont, CA (US); Jian Zhu, San Jose, CA (US); Po-Kang Wang, Los Altos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/616,116

(22) Filed: Jun. 7, 2017

(65) Prior Publication Data
US 2018/0358071 A1    Dec. 13, 2018

(51) Int. Cl.
*G11C 11/16* (2006.01)

(52) U.S. Cl.
CPC ...... *G11C 11/1695* (2013.01); *G11C 11/1653* (2013.01); *G11C 11/1659* (2013.01); *G11C 11/1675* (2013.01); *G11C 11/1693* (2013.01)

(58) Field of Classification Search
CPC .................................................. G11C 11/1675
See application file for complete search history.

(56) References Cited

U.S. PATENT DOCUMENTS

| | | | |
|---|---|---|---|
| 8,347,175 B2 | 1/2013 | Ikegawa et al. | |
| 9,007,819 B2 | 4/2015 | Ahn et al. | |
| 9,343,132 B2 | 5/2016 | Lee et al. | |
| 2010/0073998 A1* | 3/2010 | Nakayama | H01L 27/228 365/158 |
| 2013/0155763 A1* | 6/2013 | Alam | G11C 11/165 365/158 |
| 2014/0016404 A1* | 1/2014 | Kim | G11C 11/165 365/158 |

(Continued)

OTHER PUBLICATIONS

Min, Tai, et al. "A Study of Write Margin of Spin Torque Transfer Magnetic Random Access Memory Technology." IEEE Transactions on Magnetics, vol. 46, No. 6, 2010, pp. 2322-2327., doi:10.1109/tmag.2010.2043069. (Year: 2010).*

(Continued)

*Primary Examiner* — Jay W. Radke
(74) *Attorney, Agent, or Firm* — Haynes and Boone, LLP

(57) ABSTRACT

Circuits and methods for programming a MTJ stack of an MRAM cell minimizes a ferromagnetic free layer or pinned layer polarization reversal due to back-hopping. The programming begins by applying a first segment of the segment of the write pulse at a first write voltage level for a first time period to program the MTJ stack. A second segment of the segment of the write pulse at a second write voltage level that is less than the first write voltage level is applied to the magnetic tunnel junction stack for a second time period to correct the polarization of the MTJ when the MTJ stack has reversed polarization during the first time period. The second segment of the segment of the write pulse may be a ramp, or multiple ramps, or have a quiescent period between it and the first segment of the write pulse.

17 Claims, 10 Drawing Sheets

(56) References Cited

U.S. PATENT DOCUMENTS

2018/0075895 A1* 3/2018 Kishi .................. G11C 11/1675

OTHER PUBLICATIONS

"Back-hopping Phenomenon in Perpendicular Magnetic Tunnel Junctions," by Sheng-Huang Huang et al., 2015 International Symposium on VLSI Technology, Systems and Application (VLSI-TSA), Apr. 27-29, 2015, 2 pgs.
"Experimental Observation of Back-Hopping With Reference Layer Flipping by High-Voltage Pulse in Perpendicular Magnetic Tunnel Junctions," by Woojin Kim et al., IEEE Transactions on Magnetics, vol. 52, No. 7, Jul. 2016, 4 pgs.
"Spin Transfer Torque with Spin Diffusion in Magnetic Tunnel Junctions," by A. Manchon et al, Cornell University Library, Jul. 22, 2012, 5 pgs, arXiv.org:1204.5000v2 [cond-mat.mes-hall].

* cited by examiner

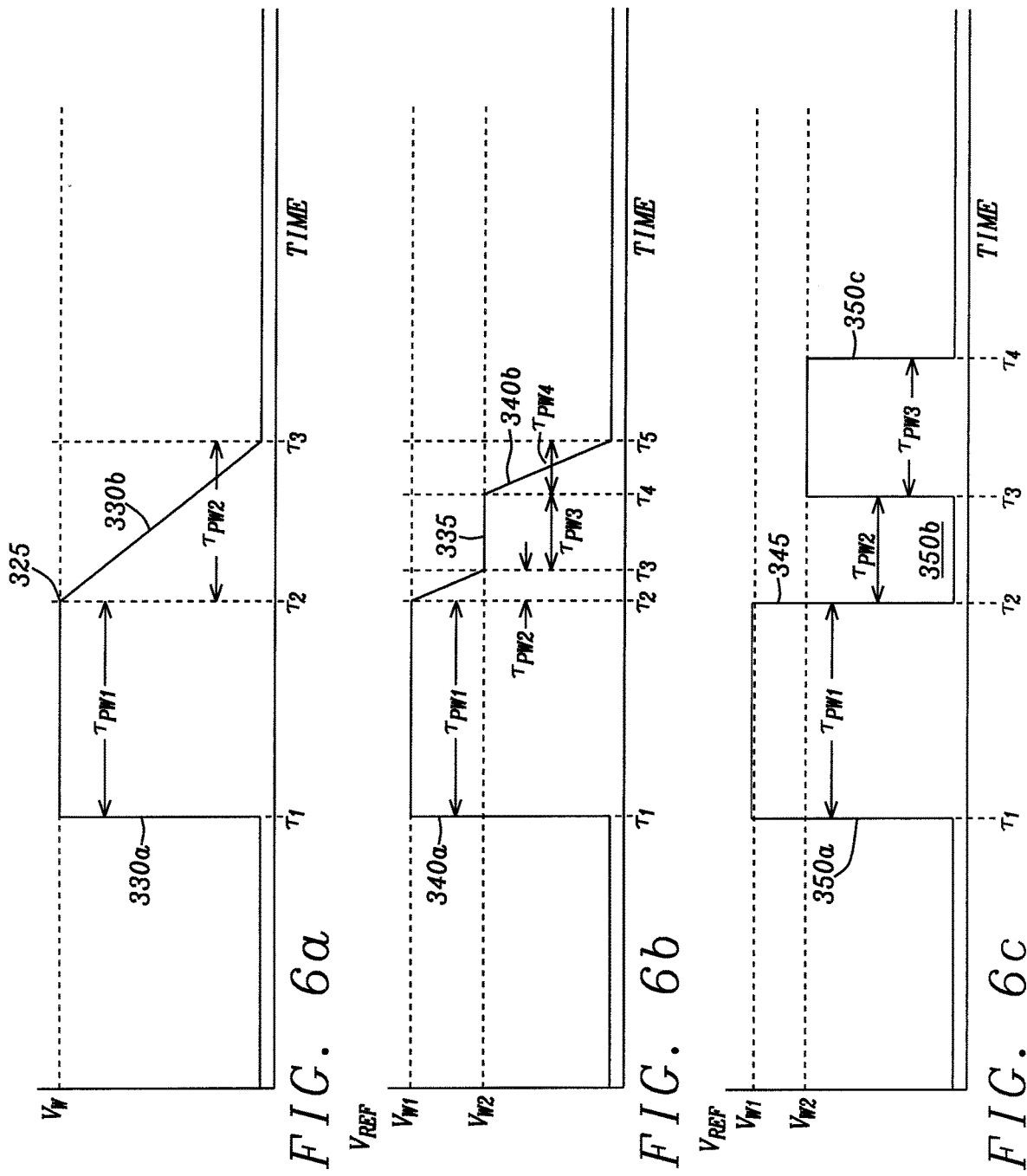

METHODS AND CIRCUITS FOR PROGRAMMING STT-MRAM CELLS FOR REDUCING BACK-HOPPING

TECHNICAL FIELD

This disclosure relates generally to a high performance Magnetic Tunnel Junction (MTJ) memory element in a spin transfer torque (STT-MRAM) device. More particularly, this disclosure relates to methods and circuits for writing that is employed for reducing back-hopping or induced magnetization reversal in the STT-MRAM device.

BACKGROUND

Spin-Transfer Torque Magnetic Random Access Memory (STT-MRAM) has a potential of becoming the "universal" memory combining the non-volatility, fast read/write and high endurance. MRAM chips are made of Magnetic Tunnel Junctions (MTJs), with a typical tri-layer structure: a ferromagnetic free layer which magnetization direction represents the stored memory information, a ferromagnetic pinned layer which magnetization direction is fixed during chip operation to provide spin transfer torque and a tunnel barrier in between that yield different resistivity for parallel or anti-parallel configuration of the magnetization direction of the ferromagnetic free layer and ferromagnetic pinned layer.

FIGS. 1a and 1b are diagrams of a magnetic random access memory cells. In both FIGS. 1a and 1b, an MRAM cell 100 has an MTJ stack 105 connected in series with a gating MOS transistor M1. A first electrode connects the ferromagnetic free layer 110 of the MTJ stack 105 with a bit line 135. The bit line 135 connects the MRAM cell 100 to a bit line decoder (not shown) that provides the necessary voltage and current signals for selecting and operating the MRAM cell 100.

The drain of the gating MOS transistor M1 is connected to a second electrode of the MTJ stack 105. The second electrode is further connected to the ferromagnetic pinned layer 120. The tunnel barrier layer 115 is placed between the ferromagnetic free layer 110 and the ferromagnetic pinned layer 120.

The source of the gating MOS transistor M1 is connected to a source line 145. The source line 145 is connected to the source decoder (not shown) that also provides the necessary voltage and current signals for selecting and operating the MRAM cell 100. The gate of the gating MOS transistor M1 is connected to a word line 140 associated with a column of the MRAM cells 100. The word line 120 is connected to a word line decoder (not shown). The word line decoder supplies a select signal to the gate of the gating MOS transistor M1 to activate or deactivate the gating MOS transistor M1 to select or deselect the MRAM cell 100 for writing or reading.

The ferromagnetic pinned layer 120 has a fixed magnetic spin orientation 125 that is relatively unaffected by the write current through the MTJ stack 105. The ferromagnetic free layer 110 has a selectable magnetic spin orientation 130 that is determined by the direction of the write current through the MTJ stack 105. FIG. 1a shows the parallel state of the MTJ stack 110 where the magnetic orientation of the ferromagnetic free layer 106 and the ferromagnetic pinned layer 108 are parallel or the same direction. This causes the resistance of the MTJ stack 110 to be low or have a commonly accepted digital state of a binary "0", since electrons preserve their spin orientation during the tunneling process and can only tunnel into the sub-band of the same spin orientation.

FIG. 1b shows the antiparallel state of the MTJ stack 105 where the magnetic orientation of the ferromagnetic free layer 110 and the ferromagnetic pinned layer 120 are in opposite directions or antiparallel. A change from the parallel magnetization configuration in FIG. 1a to the antiparallel configuration (FIG. 1b) of the two electrodes 110 and 120 will result in an exchange between the two spin sub-bands of one of the electrodes 110 and 120 for the tunneling process. The resistance then become relatively high or have a commonly accepted digital state of a binary "1". It should be noted that the structure for currently fabricated MRAMs have additional layers such as a seed layer, a capping layer and a hard mask layer for performance and integration purposes. The ferromagnetic free layer 110, ferromagnetic pinned layer 120 and the tunnel barrier 115 can have multiple layer structures.

FIG. 2 is a diagram that illustrates multiple MRAM cells 100a, 100b, 100n arranged in a single column of an array of MRAM cells. The MRAM cells 100a, 100b, 100n are structured and function as described above in FIGS. 1a and 1b. The ferromagnetic free layers 110 of the MTJ stacks 105a, 105b, . . . 105n are connected to the bit line 135 and the sources of the gating MOS transistors M1a, M1b, M1n, of the MRAM cells 100a, 100b, 100n are connected to the source line 145. Each of the gates of the gating MOS transistors M1a, M1b, M1n of the MRAM cells 100a, 100b, . . . 100n are connected respectively to the word lines 140a, 140b, . . . 140n.

The method for reading one of the selected MRAM cells 100a, 100b, 100n is to selectively activate one or more of the gates of the gating MOS transistors M1a, M1b, M1n to turn on the selected gating MOS transistors M1a, M1b, M1n. As described above, an electrical current through the MTJ stacks 105a, 105b, . . . 105n. The voltage developed across the MRAM cells 100a, 100b, 100n is sensed such that the antiparallel high resistance state is interpreted at a binary "1" and the parallel low resistance state is interpreted as a binary "0".

The method for writing the MRAM cells 100a, 100b, 100n is achieved by passing a larger current selectively through the MTJ stacks 105a, 105b, . . . 105n to change the magnetization direction of the ferromagnetic free layer 110 of the MTJ stacks 105a, 105b, . . . 105n. The ferromagnetic free layer 110 of the selected MTJ stacks 105a, 105b, . . . 105n become spin polarized either passing through or reflected by the ferromagnetic pinned layer 120. Then the spin polarized current will change the ferromagnetic free layer 110 magnetization direction and therefore write the memory cell to the desired binary state. More specifically, an electrical current flowing from the ferromagnetic free layer 110 to the ferromagnetic pinned layer 120 generates a spin transfer torque that aligns the ferromagnetic free layer 110 magnetization direction the same as that of the ferromagnetic pinned layer 120 and writes the memory cell to a binary "0". When an electrical current is flowing in the opposite direction, from the ferromagnetic pinned layer 110 to the ferromagnetic free layer 110, the electrical current generates a spin transfer torque that aligns the ferromagnetic free layer 110 magnetization direction opposite to that of the ferromagnetic pinned layer 120 and attempts to write the memory cell to a binary "1". The spin transfer torque is proportional to the amplitude of the electrical current and with an appropriately large current the probability of switching the ferromagnetic free layer 110 magnetization direction is sufficiently large to practically guarantee the switch of the ferromagnetic free layer 110 magnetization and write the selected MRAM cells 100a, 100b, 100n, properly.

Back-hopping is defined as the end result of the switching of the polarization of the ferromagnetic free layer 110 or the ferromagnetic pinned layer 120 is different than the intended. The incorrect switching may be caused by the ferromagnetic pinned layer 120 polarization being flipped or the ferromagnetic free layer 110 being flipped and then being flipped back. The general idea is that if a high voltage is applied after the ferromagnetic free layer 110 switches its polarization to the desired state, there is still strong spin torque on the ferromagnetic pinned layer 120 that tries to switch the magnetization direction of the ferromagnetic pinned layer 120. Then the ferromagnetic pinned layer 120 may switch. Alternately, the ferromagnetic pinned layer 120 may have some magnetization dynamics (i.e. magnetization direction changes with time and is not fixed to either up or down directions) that in turn flips the ferromagnetic free layer 110 back. Either of the two phenomena—the ferromagnetic pinned layer 120 flipping or the ferromagnetic free layer 110 flipping back after an initial switching will result in back-hopping.

The difference between the write currents 150 and 155 of the ferromagnetic free layer 110 and ferromagnetic pinned layer 120 determines the write margin of the selected MRAM cells 100a, 100b, 100n. In an array of MRAM cells, the write current of the ferromagnetic free layer 110 and ferromagnetic pinned layer 120 have stochastic distributions based on process, temperature, operating voltage, operating frequency, etc. Therefore, the design of the minimal write current of ferromagnetic pinned layer 120 must be sufficiently larger than the maximum of the write current of ferromagnetic free layer 110.

The access transistors M1, M2, . . . Mn, can then be turned on and off by activating one word line 140a, 140b, . . . 140n voltage, where one word line 140a, 140b, . . . 140n connects the access transistors on one row. Therefore, an individual MRAM cell can be addressed by selecting one word line 140a, 140b, . . . 140n and one pair of bit lines 135 and source lines 145. Depending on the writing polarity, the electrical current 155 can flow through the bit line 135 to the designated MRAM cells 100a, 100b, . . . 100n, then through the access transistor M1, M2, . . . , Mn and then through the source lines 145. Alternately, the reverse flow will occur and the electrical current 150 will flow through the source lines 145 to the designated MRAM cells 100a, 100b, . . . 100n, then through the access transistor M1, M2, . . . , Mn and then through the bit line 135. The bit lines 135 and source lines 145 in the MRAM device are likely to be placed many metal layers apart and therefore their thickness and resistivity are likely to be different. As a result, the MRAM cells 100a, 100b, . . . 100n on the same column will be in series with a different length of the bit lines 135 and source lines 145, which means that the MRAM cells 100a, 100b, . . . 100n connect to different series resistance for the write process. The actual writing voltage on the MTJ stacks 105a, 105b, . . . 105n at the beginning of the bit line 135 will be different than that of the MTJ stacks 105a, 105b, . . . 105n at the end of the bit line 135. Therefore, the MRAM cell 100n at the end of the bit line 135 does not have enough voltage developed across the MTJ stack 105n for switching and the MRAM cell 100a at the beginning of the bit line 135 already has too much voltage developing across the MTJ stack 105a to cause back hopping in the ferromagnetic pinned layer 120. This effect will become stronger for more advanced technology nodes since the narrower bit lines 135 and source lines 145 in the MRAM device put their resistance closer to that of the MTJ stacks 105a, 105b, . . . 105n and the variation of the bit lines 135 and source lines 145 resistance makes a larger impact for the actual writing voltage on the MTJ stacks 105a, 105b, . . . 105n.

SUMMARY

An object of this disclosure is to provide circuits and methods for writing an antiparallel state to a magnetic tunnel junction stack while minimizing the probability of a ferromagnetic pinned layer experiencing polarization reversal To accomplish at least this object, a method for writing a magnetic tunnel junction (MTJ) stack within a magnetic random access memory (MRAM) cell begins by selecting at least one MRAM cell within an array of MRAM cells. A gating switch of the selected at least one MRAM cell is activated. A first segment of the write pulse is applied to the MRAM cell for establishing a first current flow through the at least one MTJ stack. The first segment of the write pulse has a first voltage level and is established for a first time period for writing the at least one MTJ cell.

At the end of the first time period, a second segment of the write pulse is applied to the at least one MTJ stack for establishing a second current flow through the at least one MTJ stack. The second segment of the write pulse has a second voltage level that is less than the first voltage level and is established for a second time period. The second voltage level and the second time period is set such that when the at least one MTJ stack is in a reverse polarization, the at least one MTJ stack that is incorrectly written is set to a correct polarization. At the end of the second time period the write method is completed.

In various embodiments, the second segment of the write pulse is a decreasing ramp starting at the first voltage level and ending at the second voltage level at the end of the second time period. In other embodiments, the second segment of the write pulse is a decreasing ramp starting at the first voltage level and ending at the second voltage level at the end of a first portion of the second time period. The second segment of the write pulse remains at the second voltage level for the second portion of the second time period. At the end of the second portion of the second time period, the second segment of the write pulse then again assumes a decreasing ramp for a third portion of the second time period. The decreasing ramp of the second segment of the write pulse during the third portion of the second time period starts at the second voltage level and ends at the reference voltage level applied to the at least one MRAM cell.

In various embodiments, the first segment of the write pulse and the second segment of the write pulse are separated by quiescent period where the voltage applied to the at least one MTJ stack is the reference voltage level. The quiescent period has a third time period that is less than the first time period and the second time period.

In some embodiments that accomplish at least this object, a control circuit is configured for developing the timing and control signals that applied to an array of MRAM cells. The control circuit has a word line decoder, a bit line decoder, and a source line decoder for applying the read signals and the write signal to the MRAM cells of the array of MRAM cells. The word line decoder provides the activation signals for turning on the gating switches of one row of MRAM cells of the array of MRAM cells. The bit line decoder provides the read pulse for determining a data state of the MRAM cells of the selected row of MRAM cells of the array of MRAM cells during a read operation. The source line decoder sense a read current passing through the selected MRAM cells to determine a data state of the MRAM cells.

The bit line decoder and the source line decoder provide the write signals for programming the data state of the MRAM cells of the selected row of MRAM cells. Those MRAM cells of the selected row of MRAM cells that are to be programmed to a parallel state, receive the programming pulse from the source line decoder and those MRAM cells of the selected row of MRAM cells that are to be programmed to an antiparallel state, receive the programming pulse from the word line decoder. The control circuit has a pulse generator configured for generating the voltage pulse signals for the reading and writing the MRAM cells of the selected row of the array of MRAM cells. In the writing of the MRAM cells of the selected row of MRAM cells, the pulse generator generates a first segment of the write pulse that is applied to the MRAM cells of the selected row of MRAM cells for establishing a first current flow through the MRAM cells of the selected row of MRAM cells. The direction of the first current flow each of the MRAM cells of the selected row of MRAM cells is determined whether the data state is a parallel or antiparallel polarization. The first segment of the write pulse has a first voltage level and is established for a first time period for writing the MRAM cells of the selected row of MRAM cells.

At the end of the first time, a second segment of the write pulse is applied to the MRAM cells of the selected row of MRAM cells for establishing a second current flow through MRAM cells of the selected row of MRAM cells. The second segment of the write pulse has a second voltage level that is less than the first voltage level and is established for a second time period. The second voltage level and the second time period is set such that when any of the MRAM cells of the selected row of MRAM cells are in a reverse polarization, the MRAM cells of the selected row of MRAM cells that are incorrectly written are set to a correct polarization. At the end of the second time period the write method is completed.

In various embodiments, the second segment of the write pulse is a decreasing ramp starting at the first voltage level and ending at the second voltage level at the end of the second time period. In other embodiments, the second segment of the write pulse is a decreasing ramp starting at the first voltage level and ending at the second voltage level at the end of a first portion second time period. The second pulse remains at the second voltage level for a second portion of the second time period. At the end of the second portion of the second time period, the second segment of the write pulse then again assumes a decreasing ramp for a third portion of the second time period. The decreasing ramp of the second segment of the write pulse during the third portion of the second time period starts at the second voltage level and ends at the reference voltage level applied to the MRAM cells of the selected row of MRAM cells.

In various embodiments, the first segment of the write pulse and the second segment of the write pulse are separated by quiescent period where the voltage applied to the MRAM cells of the selected row of MRAM cells is the reference voltage level. The quiescent period has a third time period that is less than the first time period and the second time period.

In various embodiments that accomplish at least this object, an integrated circuit includes an array of MRAM cells formed in rows and columns. A control circuit is connected to the rows and columns of the array of MRAM cells for applying the timing and control signals for reading and writing digital data to the MRAM cells, wherein the digital data is determined by the parallel or antiparallel polarization of the MTJ stacks of the MRAM cells. The control circuit is structured and functions as described above.

BRIEF DESCRIPTION OF THE DRAWINGS

FIGS. 6a-6c are plots of various implementations of a write pulse for programming an MTJ stack of an MRAM cell embodying the principles of the present disclosure.

DETAILED DESCRIPTION

The circuits and methods that embody the principle of the present disclosure program selected magnetic random access memory (MRAM) cells by applying a voltage across the selected MRAM cells such that a current through the selected MRAM cells is parallel or antiparallel with the polarization of the ferromagnetic pinned layer. The current will be parallel to the polarization of the ferromagnetic pinned layer when the desired polarization of the ferromagnetic free layer is parallel with the ferromagnetic pinned layer. The current will be antiparallel to the polarization of the ferromagnetic pinned layer when the desired polarization of the ferromagnetic free layer is antiparallel with the ferromagnetic pinned layer.

The write signal of the composed of two time periods during the write operation of the selected MRAM cells. In a first time period, the write voltage is such that all the desired selected MRAM cells have their ferromagnetic free layers switched. Some of the ferromagnetic pinned layers and some of the ferromagnetic free layers may have switched incorrectly or back-hopped. The second time period of the write operation employs a lower voltage amplitude that is sufficient for causing those MRAM cells that have back-hopped to reverse the polarization to the desired direction. The voltage amplitude during the second time period is sufficient to prevent back-hopping to occur or re-occur in the MRAM cell.

Figure 1B:
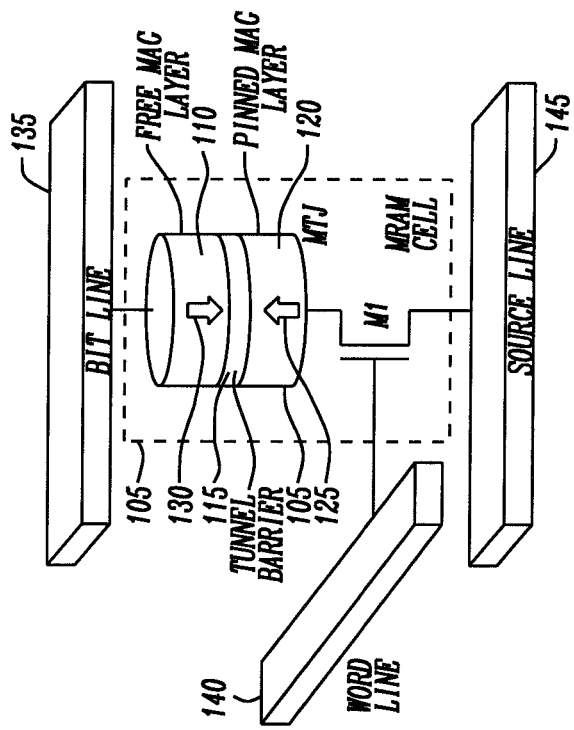
FIGS. 1a and 1b are diagrams of a magnetic random access memory cells of the related art.
Figure 1A:
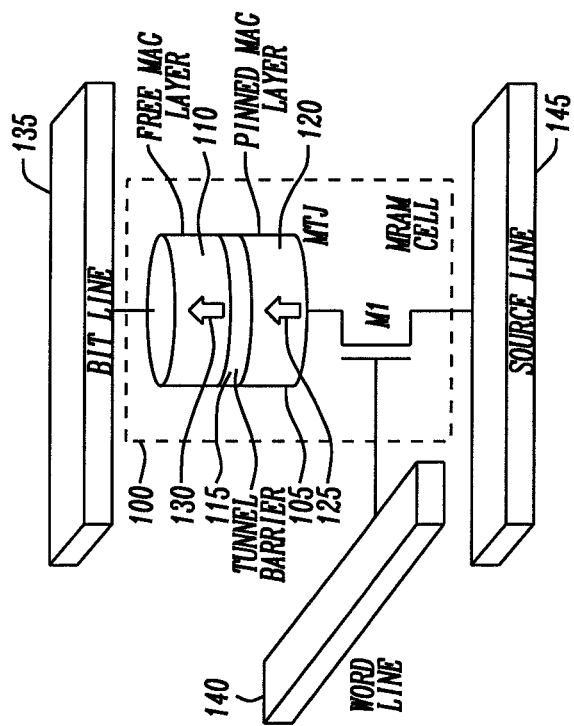
Figure 2:
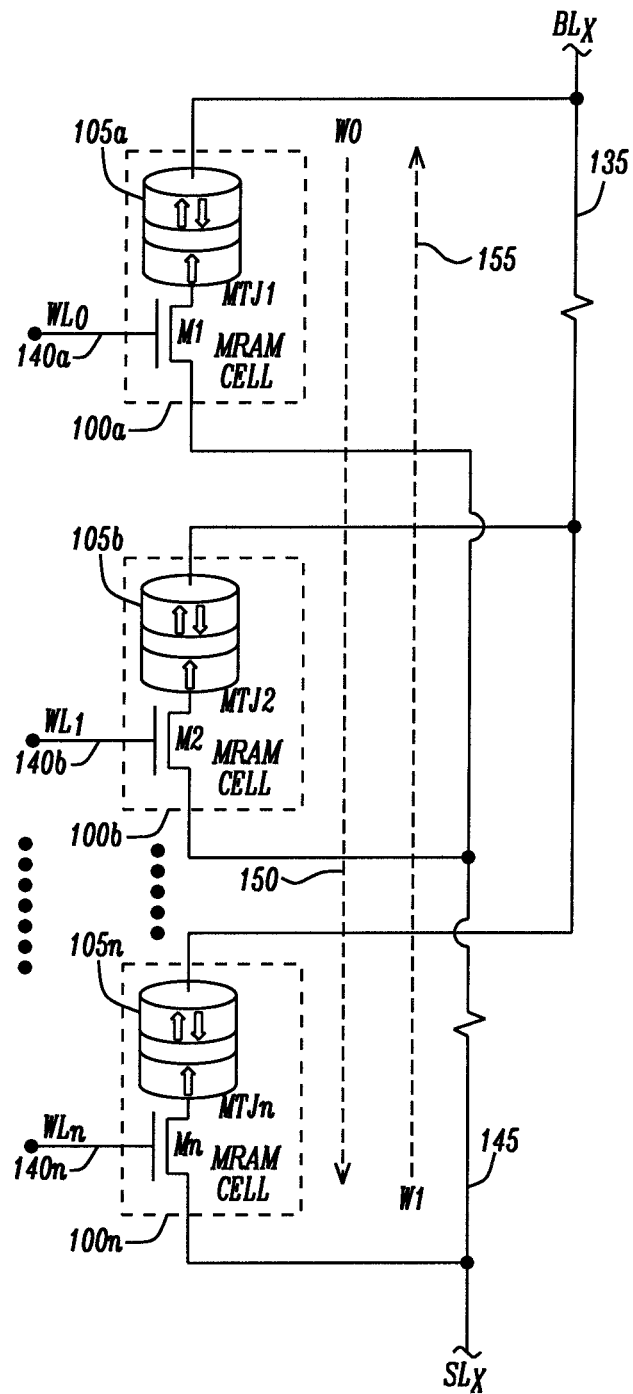
FIG. 2 is a diagram that illustrates multiple MRAM cells arranged in a single column of an array of MRAM cells of the related art.
Figure 3:
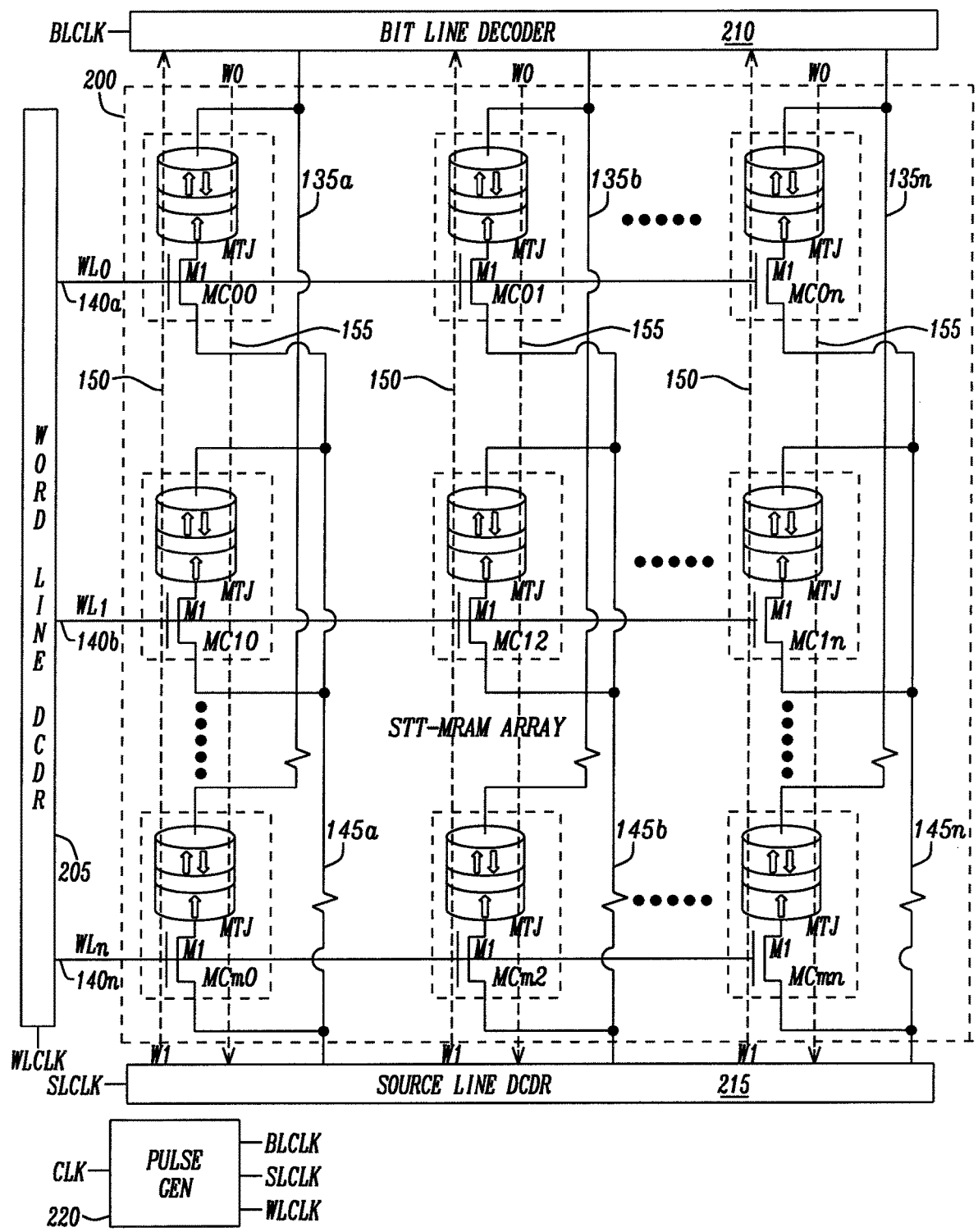
FIG. 3 is a diagram that illustrates an integrated circuit with an array of MRAM cells and the control circuitry for operating the array of MRAM cells embodying the principles of the present disclosure.

FIG. 3 is a diagram that illustrates an integrated circuit with an array 200 of MRAM cells MC00, ..., MC1n, ... MCm0, ..., MCmn and the control circuitry for operating the array 200 of MRAM cells MC00, ..., MC1n, ... MCm0, ..., MCmn. The structure of the MRAM cells MC00, ..., MC1n, ..., MCm0, ..., MCmn is identical to that of FIGS. 1a and 1b. The control circuitry consists of the word line decoder 205, the bit line decoder 210, the source line decoder 215, and the pulse generator 220. The word line decoder receives an address word (not shown) for both a read operation and the write operation that is decoded to select one of the rows of the array 200 of the MRAM cells MC00, ..., MC1n, ... MCm0, ..., MCmn.

For a read operation, the bit line decoder 210 and the source line decoder 215 receives a read command for determining the data state of the MRAM cells MC00, ..., MC1n, ... MCm0, ..., MCmn of the selected row of the array 200. A read voltage is applied to the bit lines 135a, 135b, ..., 135n and the resulting current indicating the polarization state of the MRAM cells MC00, ..., MC1n, ... MCm0, ..., MCmn is sensed by the source line decoder to determine the data stored on the selected MRAM cells MC00, ..., MC1n, ... MCm0, ..., MCmn. The sensed data is transferred to external circuitry (not shown) for further processing.

For a write operation, the bit line decoder 210 and the source line decoder 215 receives a write command and data to be written for determining the data state of the MRAM cells MC00, ..., MC1n, ... MCm0, ..., MCmn of the selected row of the array 200. Conventionally, the parallel state of the MTJ stack of the selected MRAM cells MC00, ..., MC1n, ... MCm0, ..., MCmn is considered to represent the binary "0" and the antiparallel state of the MTJ stack of the selected MRAM cells MC00, ..., MC1n, ... MCm0, ..., MCmn is considered to represent the binary "1". The data to be written is examined by the bit line decoder 210 and the source line decoder 215. If the data to be written to one of the MRAM cells MC00, ..., MC1n, ... MCm0, ..., MCmn is to change the data state of the MTJ stack from parallel to antiparallel, then the source line decoder 215 is configured to drive a programming voltage to the source line 145a, 145b, ..., 145n and thus to the source of the gating transistor M1 of the selected MRAM cell MC00, ..., MC1n, ... MCm0, ..., MCmn. The bit line decoder 210 is configured to connect the bit line 135a, 135b, ..., 135n to a reference voltage level. The write one W1 current 150 flows from the source line decoder 215 through the source line 145a, 145b, ..., 145n to the selected MRAM cell MC00, ..., MC1n, ... MCm0, ..., MCmn. The current flows through the MRAM cell MC00, ..., MC1n, ... MCm0, ..., MCmn to the bit line 135a, 135b, ..., 135n and through the bit line 1350a, 135b, ..., 135n to the bit line decoder 210.

If the data to be written to one of the MRAM cells MC00, ..., MC1n, ... MCm0, ..., MCmn is to change the data state of the MTJ stack from antiparallel to parallel, then the bit line decoder 210 is configured to drive a programming voltage to the bit line 135a, 135b, ..., 135n and thus to a first electrode of the MTJ stack of the selected MRAM cell MC00, ..., MC1n, ... MCm0, ..., MCmn. The current 155 passes through the selected MRAM cell MC00, ..., MC1n, ... MCm0, ..., MCmn to the source line 145a, 145b, ..., 145n to the source line decoder 215. The source line decoder 215 is configured to connect the source line 145a, 145b, ..., 145n to the reference voltage level. The write zero W0 current 155 flows from the bit line decoder 210 through the bit line 135a, 135b, ..., 135n to the selected MRAM cell MC00, ..., MC1n, ... MCm0, ..., MCmn. The current 155 flows through the MRAM cell MC00, ..., MC1n, ... MCm0, ..., MCmn to the source line 145a, 145b, ..., 145n and through the source line 145a, 145b, ..., 145n to the source line decoder 215.

The pulse generator 220 generates the necessary timing signals. The word line clock WLCLK provides the necessary timing for the word line activating signals applied to the word lines 140a, 140b, ..., 140n. The bit line clock BLCLK provides the necessary timing for the bit line activating signals applied to the bit lines 135a, 135b, ..., 135n. The source line clock SLCLK provides the necessary timing for the source line activating signals applied to the source lines 145a, 145b, ..., 145n. The master clock CLK provides the basic timing for the pulse generator for generating these necessary timing signals.

Figures 4A, 4B:
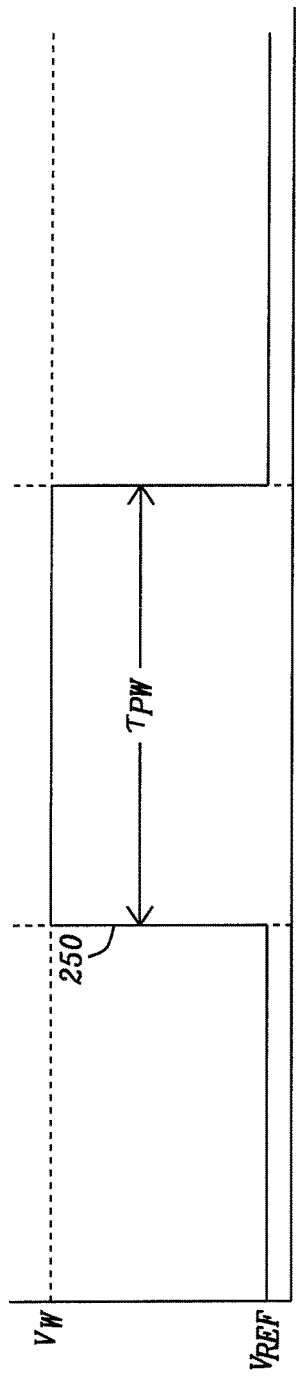
FIG. 4a is a plot of a write pulse for programming an MTJ stack of an MRAM cell of the related art.
FIG. 4b is a chart of the error count of an array of MRAM cells as a function of applied voltages to the bit line/source lines and the word line for illustrating the effects of back hopping of the related art.

FIG. 4a is a plot of a write pulse 250 for programming an MTJ stack of MRAM cells MC00, ..., MC1n, ... MCm0, ..., MCmn of the related art. The write pulse will be applied to a selected bit line 135a, 135b, ..., 135n for writing a binary "1" and to the source line for writing a binary "0". When the word line activation signal is applied to the selected word line 140a, 140b, ..., 140n, the gating transistors M1 of the selected row of the array 200 of MRAM cells MC00, ..., MC1n, ... MCm0, ..., MCmn are turned on. At the time $\tau_1$ the write signal 250 rises from the reference voltage level $V_{REF}$ to the write voltage level V. The write signal 250 is maintained at the write voltage level $V_W$ for a period $\tau_{PW}$. At the time $\tau_2$, the write signal 250 is returned to the reference voltage level $V_{REF}$. The write period $\tau_{PW}$, as is known in the art, is determined by the desired write performance of the MRAM cells MC00, ..., MC1n, ... MCm0, ..., MCmn, the voltage breakdown limits of the MTJ stacks and the gating transistors M1 of the MRAM cells MC00, ..., MC1n, ... MCm0, ..., MCm, and the error tolerance due to the back-hopping within the array 200 of MRAM cells MC00, ..., MC1n, ... MCm0, ..., MCmn. The back-hopping, as discussed above, limits the performance of the array 200 of MRAM cells MC00, ..., MC1n, ... MCm0, ..., MCmn.

FIG. 4b is a chart of the error count of an array 200 of MRAM cells MC00, ..., MC1n, ... MCm0, ..., MCmn as a function of applied voltages to the bit lines 135a, 135b, ..., 135n or source lines 145a, 145b, ..., 145n and the word line140a, 140b, ..., 140n for illustrating the effects of back hopping of the related art. In the region 275 where the word line voltage VWL, the bit line voltage VBL, or the source line voltage VSL are too low, the number of errors is too great such that the MRAM cells MC00, ..., MC1n, ... MCm0, ..., MCmn is considered nonfunctional. In the region 280, the word line voltage VWL, the bit line voltage VBL, or the source line voltage VSL are at sufficient levels that MRAM cells MC00, ..., MC1n, ... MCm0, ..., MCmn is considered totally functional. In the region 285, the word line voltage VWL, the bit line voltage VBL, or the source line voltage VSL are at levels that MRAM cells MC00, ..., MC1n, ..., MCm0, ..., MCmn may experience polarization reversal or back-hopping. This causes the MRAM cells MC00, ..., MC1n, ... MCm0, ..., MCmn to incur a large number error that are sufficient to cause the MRAM cells MC00, ..., MC1n, ... MCm0, ..., MCmn to be considered nonfunctional, also.

Figure 5A:
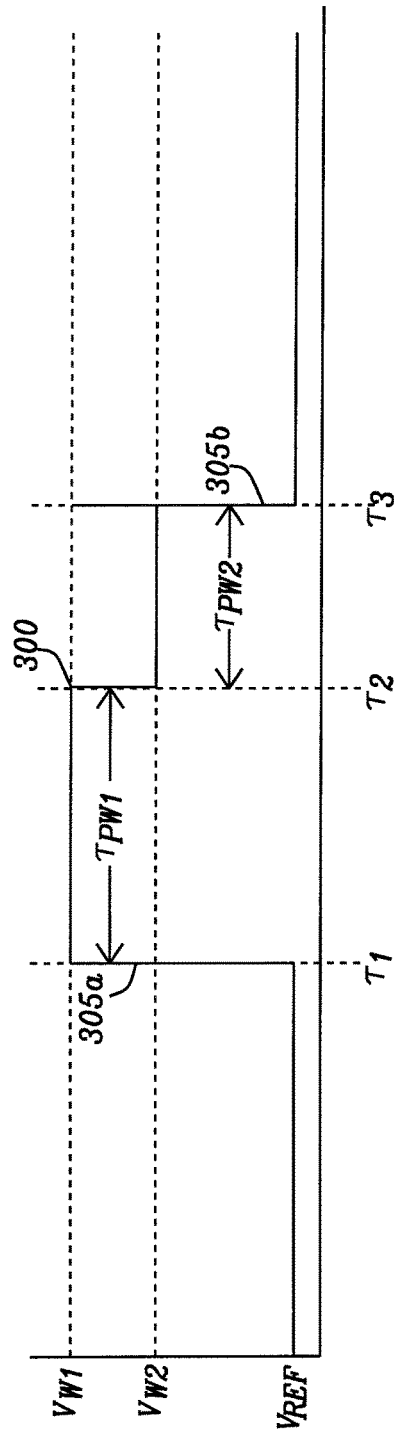
FIG. 5a is a plot of a write pulse for programming an MTJ stack of an MRAM cell embodying the principles of the present disclosure.

FIG. 5a is a plot of a write pulse 300 for programming an MTJ stack of MRAM cells MC00, ..., MC1n, ... MCm0, ..., MCmn embodying the principles of the present disclosure. The write pulse 300 will be applied to a selected bit line 135a, 135b, . . . , 135n for writing a binary "1" and to the source line for writing a binary "0". When the word line activation signal is applied to the selected word line140a, 140b, . . . , 140n, the gating transistors M1 of the selected row of the array 200 of MRAM cells MC00, . . . , MC1n, . . . MCm0, . . . , MCmn are turned on. At the time $\tau_1$ the first write segment 305a of the write signal 300 rises from the reference voltage level $V_{REF}$ to the first write voltage level $V_{W1}$. The first write segment 305a of the write signal 300 is maintained at the first write voltage level $V_{W1}$ for a first write period $\tau_{PW1}$. At the time $\tau_2$, the first write segment 305a of the write signal 300 ends and the second write segment 305b begins with the voltage level of the second segment 305b falling from first write voltage level $V_{W1}$ to the second write voltage level $V_{W2}$ for a second write period $\tau_{PW2}$. At the time $\tau_3$, the write signal falls to the reference voltage level $V_{REF}$ to end the write of the selected MRAM cell MC00, . . . , MC1n, vMCm0, . . . , MCmn.

The first write period $\tau_{PW1}$ and the first write voltage level $V_{W1}$ are chosen to write all the selected MRAM cells MC00, . . . , MC1n, . . . MCm0, . . . , MCmn of the array 200 of MRAM cells MC00, . . . , MC1n, . . . MCm0, . . . , MCmn. Some of these selected MRAM cells MC00, . . . , MC1n, . . . MCm0, vMCmn will experience reversal of the desired polarization or back-hopping. The second write period $\tau_{PW2}$ and the second write voltage level $V_{W2}$ are chosen to write all the selected MRAM cells MC00, . . . , MC1n, . . . MCm0, . . . , MCmn of the array 200 of MRAM cells MC00, . . . , MC1n, . . . , MCm0, . . . , MCmn those selected MRAM cells MC00, . . . , MC1n, . . . MCm0, . . . , MCmn that have experienced reversal of the desired polarization or back-hopping will be correctly reversed to the correct polarization.

Figure 5B:
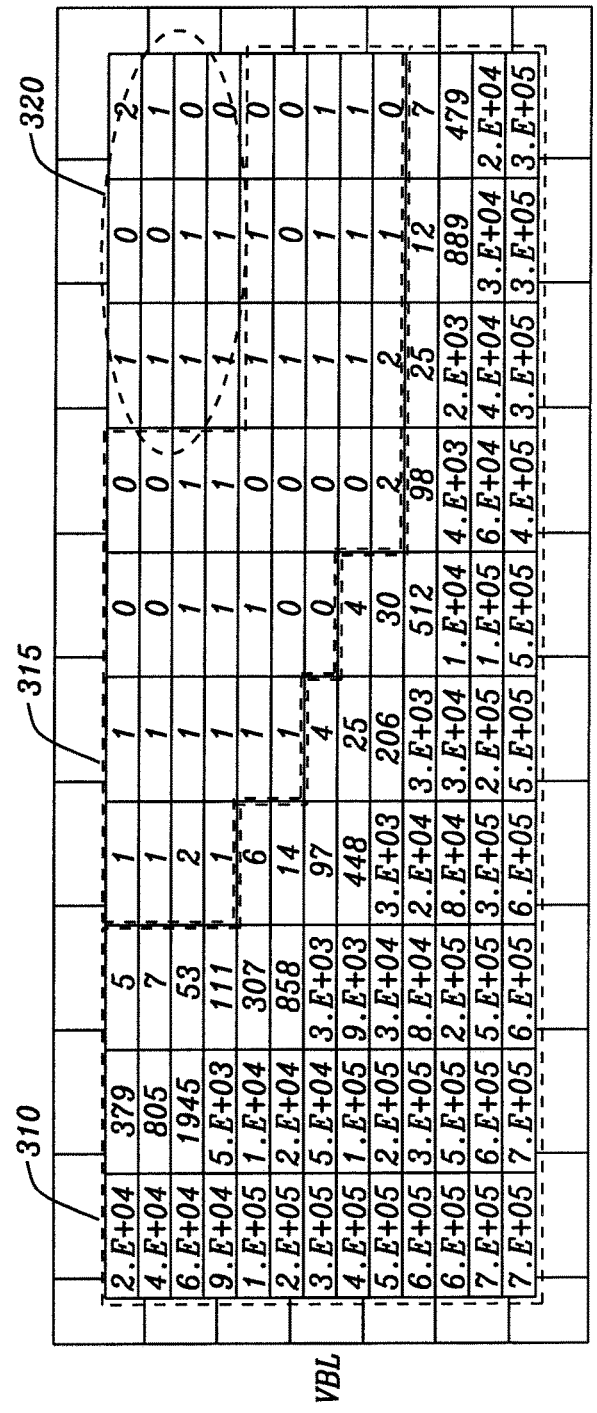
FIG. 5b is a chart of the error count of an array of MRAM cells as a function of applied voltages to the bit line/source lines and the word line for illustrating the improvement in the effects of back hopping of the circuits and methods embodying the principles of the present disclosure.

FIG. 5b is a chart of the error count of an array 200 of MRAM cells MC00, . . . , MC1n, . . . MCm0, . . . , MCmn as a function of applied voltages to the to the bit lines 135a, 135b, . . . , 135n, source lines 145a, 145b, . . . , 145n, and the word line140a, 140b, . . . , 140n for illustrating the improvement in the effects of back hopping on the array 200 of MRAM cells MC00, . . . , MC1n, . . . MCm0, . . . , MCmn embodying the principles of the present disclosure.

In the region 310 where the word line voltage VWL, the bit line voltage VBL, or the source line voltage VSL are too low, the number of errors is too great such that the MRAM cells MC00, . . . , MC1n, . . . MCm0, . . . , MCmn is considered nonfunctional. In the region 315, the word line voltage VWL, the bit line voltage VBL, or the source line voltage VSL are at the levels and timing as shown above in FIG. 5a. The MRAM cells MC00, . . . , MC1n, . . . MCm0, . . . , MCmn are considered totally functional in the region 315. In the region 320, the word line voltage VWL, the bit line voltage VBL, or the source line voltage VSL are at levels and timings as described above for FIG. 5a. Those MRAM cells MC00, . . . , MC1n, . . . MCm0, . . . , MCmn that had experienced polarization reversal or back-hopping are now mostly reversed and the MRAM cells MC00, . . . , MC1n, . . . MCm0, . . . , MCmn now have either no errors or a very low number of errors such that the MRAM cells MC00, . . . , MC1n, . . . MCm0, . . . , MCmn to be considered functional.

FIGS. 6a-6c are plots of various implementations of a write pulse for programming an MTJ stack of an MRAM cell MC00, . . . , MC1n, . . . MCm0, . . . , MCmn embodying the principles of the present disclosure. FIG. 6a is a plot of a write pulse 325 for programming an MTJ stack of MRAM cells MC00, . . . , MC1n, . . . MCm0, . . . , MCmn embodying the principles of the present disclosure. The write pulse 325 will be applied to a selected source line 145a, 145b, . . . , 145n for writing a binary "1" and to the selected bit line 135a, 135b, . . . , 135n for writing a binary "0". When the word line activation signal is applied to the selected word line140a, 140b, 140n, the gating transistors M1 of the selected row of the array 200 of MRAM cells MC00, . . . , MC1n, . . . , MCm0, . . . , MCmn are turned on. At the time $\tau_1$ the first write segment 330a of the write signal 325 rises from the reference voltage level $V_{REF}$ to the write voltage level $V_W$. The first write segment 330a of the write signal 325 is maintained at the write voltage level $V_W$ for a first write period $\tau_{PW1}$. At the time $\tau_2$, the first write segment 330a of the write signal 325 ends. The second write segment 330b begins with the voltage level of the second segment 330b falling as a linear ramp from the write voltage level $V_W$ to the reference voltage level $V_{REF}$ for a second write period $\tau_{PW2}$. The write operation of the selected MRAM cell MC00, . . . , MC1n, . . . MCm0, . . . , MCmn ends at the time $\tau_3$.

The first write period $\tau_{PW1}$ and the first write voltage level $V_{W1}$ are chosen to write all the selected MRAM cells MC00, . . . , MC1n, . . . MCm0, . . . , MCmn of the array 200 of MRAM cells MC00, . . . , MC1n, . . . MCm0, . . . , MCmn. Some of these selected MRAM cells MC00, . . . , MC1n, . . . MCm0, . . . , MCmn will experience reversal of the desired polarization or back-hopping. The second write period $\tau_{PW2}$ is chosen to write all the selected MRAM cells MC00, . . . , MC1n, . . . MCm0, . . . , MCmn of the array 200 of MRAM cells MC00, . . . , MC1n, . . . MCm0, . . . , MCmn those selected MRAM cells MC00, . . . , MC1n, . . . MCm0, . . . , MCmn that have experienced reversal of the desired polarization or back-hopping to be correctly reversed to the correct polarization.

FIG. 6b is a plot of a write pulse 335 for programming an MTJ stack of MRAM cells MC00, . . . , MC1n, . . . MCm0, . . . , MCmn embodying the principles of the present disclosure. The write pulse 335 will be applied to a selected source line 145a, 145b, . . . , 145n for writing a binary "1" and to the selected bit line 135a, 135b, . . . , 135n for writing a binary "0". When the word line activation signal is applied to the selected word line 140a, 140b, 140n, the gating transistors M1 of the selected row of the array 200 of MRAM cells MC00, . . . , MC1n, . . . MCm0, . . . , MCmn are turned on. At the time $\tau_1$ the first write segment 340a of the write signal 335 rises from the reference voltage level $V_{REF}$ to the write voltage level $V_W$. The first write segment 330a of the write signal 335 is maintained at the write voltage level $V_W$ for a first write period $\tau_{PW1}$. At the time $\tau_2$, the first write segment 340a of the write signal 335 ends. The second write segment 340b begins with the voltage level of the second segment 340b falling as a linear ramp from the write voltage level $V_W$ to the second write voltage level $V_{W2}$ over a second write period $\tau_{PW2}$. At the time $\tau_3$, the second write segment 340b of the write signal 335 ends. The third write segment 340c begins with the voltage level of the third segment 340b remaining at the second write voltage level $V_{W2}$ for a third write period $\tau_{PW3}$. At the time $\tau_4$, the third write segment 340c of the write signal 335 ends. The fourth write segment 340d begins with the voltage level of the second segment 340b falling as a linear ramp from the second write voltage level $V_{W2}$ to the reference voltage level $V_{REF}$ over a fourth write period $\tau_{PW4}$. The write operation of the selected MRAM cell MC00, . . . , MC1n, . . . MCm0, . . . , MCmn ends at the time $\tau_5$.

The first write period $\tau_{PW1}$ and the first write voltage level $V_{W1}$ are chosen to write all the selected MRAM cells MC00, ..., MC1n, ... MCm0, ..., MCmn of the array 200 of MRAM cells MC00, ..., MC1n, ... MCm0, ..., MCmn. Some of these selected MRAM cells MC00, ..., MC1n, ... MCm0, ..., MCmn will experience reversal of the desired polarization or back-hopping. The second write period $\tau_{PW2}$, third write period $\tau_{PW2}$, fourth write period $\tau_{PW4}$, and the fifth write period $\tau_{PW2}$, and the second write voltage level $V_{W2}$ are chosen to write all the selected MRAM cells MC00, ..., MC1n, ..., MCm0, ..., MCmn of the array 200 of MRAM cells MC00, ..., MC1n, ... MCm0, ..., MCmn those selected MRAM cells MC00, ..., MC1n, ... MCm0, ..., MCmn that have experienced reversal of the desired polarization or back-hopping to be correctly reversed to the correct polarization.

FIG. 6c is a plot of a write pulse 345 for programming an MTJ stack of MRAM cells MC00, ..., MC1n, ... MCm0, ..., MCmn embodying the principles of the present disclosure. The write pulse 345 will be applied to a selected source lines 145a, 145b, ..., 145n for writing a binary "1" and to the selected bit line 135a, 135b, ..., 135n for writing a binary "0". When the word line activation signal is applied to the selected word line 140a, 140b, ..., 140n, the gating transistors M1 of the selected row of the array 200 of MRAM cells MC00, ..., MC1n, ... MCm0, ..., MCmn are turned on. At the time $\tau_1$ the first write segment 350a of the write signal 345 rises from the reference voltage level $V_{REF}$ to the first write voltage level $V_{W1}$. The first write segment 350a of the write signal 345 is maintained at the first write voltage level $V_{W1}$ for a first write period $\tau_{PW1}$. At the time $\tau_2$, the first write segment 350a of the write signal 345 ends and quiescent segment 350b begins with the voltage level of the second segment 450b falling from first write voltage level $V_{W1}$ to the reference voltage level $V_{REF}$ for a second write period $\tau_{PW2}$. At the time $\tau_3$, the quiescent segment 350a of the write signal 345 ends and the second write segment 350b begins with the voltage level of the second segment 450b raising from reference voltage level $V_{REF}$ to the second write voltage level $V_{W2}$ for a second write period $\tau_{PW3}$. At the time $\tau_4$, the write signal falls to the reference voltage level $V_{REF}$ to end the write of the selected MRAM cell MC00, ..., MC1n, ... MCm0, ..., MCmn.

The first write period $\tau_{PW1}$ and the first write voltage level $V_{W1}$ are chosen to write all the selected MRAM cells MC00, ..., MC1n, ... MCm0, ..., MCmn of the array 200 of MRAM cells MC00, ..., MC1n, ... MCm0, ..., MCmn. Some of these selected MRAM cells MC00, ..., MC1n, ... MCm0, ..., MCmn will experience reversal of the desired polarization or back-hopping. The write period $\tau_{PW3}$ and the second write voltage level $V_{W2}$ are chosen to write all the selected MRAM cells MC00, ..., MC1n, ..., MCm0, ..., MCmn of the array 200 of MRAM cells MC00, ..., MC1n, ... MCm0, ..., MCmn those selected MRAM cells MC00, ..., MC1n, ..., MCm0, ..., MCmn that have experienced reversal of the desired polarization or back-hopping will be correctly reversed to the correct polarization.

As is known in the art, MRAM cells MC00, ..., MC1n, ... MCm0, ..., MCmn that have the higher the writing voltage/current will have a the faster the write operation. Memory speed is one of the determining factors of computer system performance. Three parameters limit the maximum voltage that can be applied the MRAM cells MC00, ..., MC1n, ... MCm0, ..., MCmn. The first parameter is the capability of the gating transistor M1. The second parameter is the breakdown voltage of the MTJ stack and the gating transistor. The third parameter is the back hopping. Based on the application, a computer system will have certain performance criteria that will determine the time limits for a write cycle of the MRAM cells MC00, ..., MC1n, ..., MCm0, ..., MCmn. Based on the breakdown voltages, the performance of the gating transistor M1, and the computer system requirements. The amplitude of the first write voltage level $V_{W1}$ and the period of the of the first write period $\tau_{PW1}$ must be sufficient to write the data to all the MRAM cells MC00, ..., MC1n, ... MCm0, ..., MCmn of the array 200. The back-hopping recovery period of the second write period $\tau_{PW2}$ and the second write voltage $V_{W1}$ are established to promote the correct writing of those of the MRAM cells MC00, ..., MC1n, ... MCm0, ..., MCmn that were reversed due to the back-hopping phenomena.

Figure 7A:
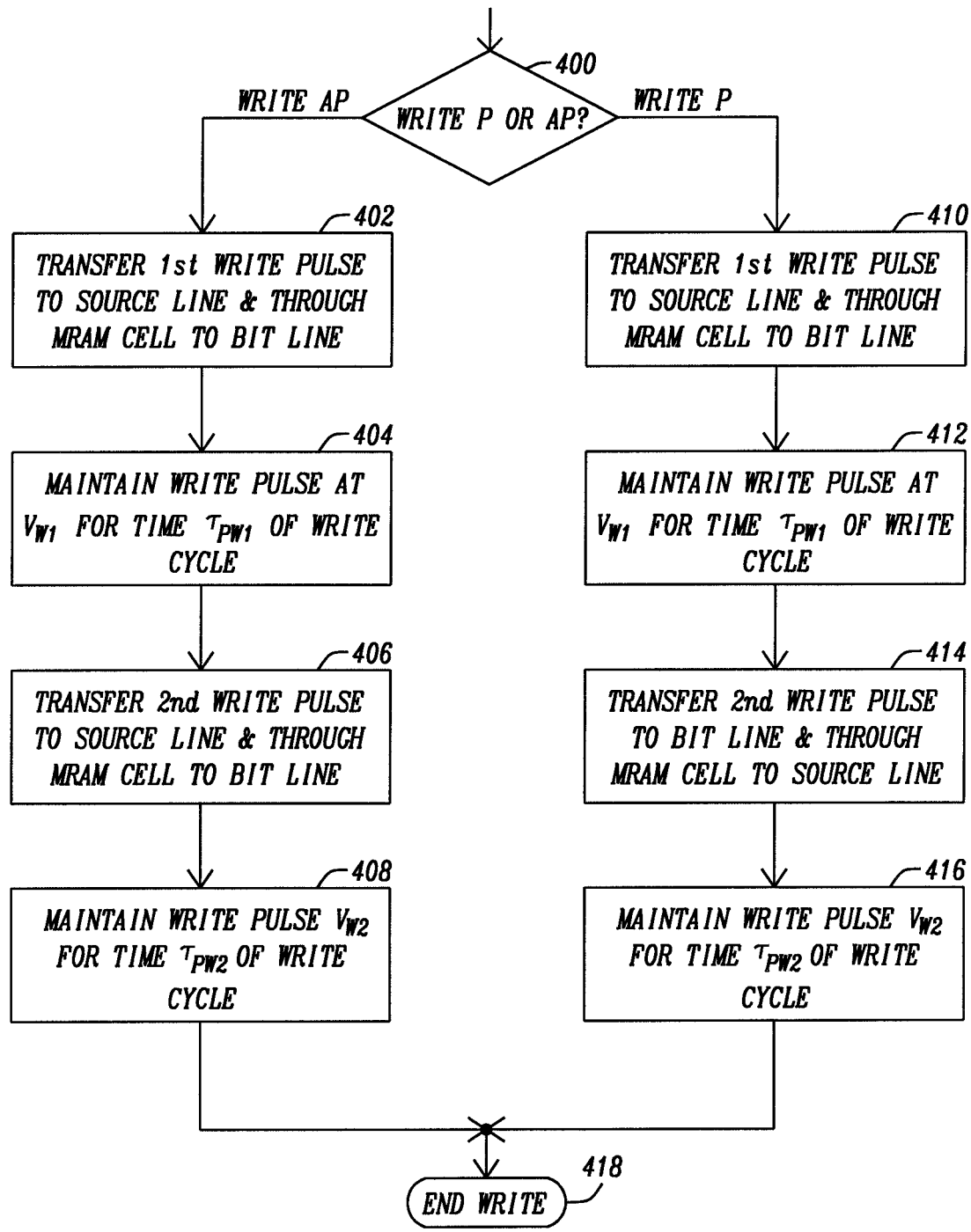
FIGS. 7a-7d are flowcharts of various methods for programming an MTJ stack of an MRAM cell embodying the principles of the present disclosure.

FIGS. 7a-7d are flowcharts of various methods for programming an MTJ stack of MRAM cells MC00, ..., MC1n, ... MCm0, ..., MCmn embodying the principles of the present disclosure. Refer now to FIGS. 3, 5a, and 7a. The bit line decoder 210 and the source line decoder 215 receive the write command and determine (Box 400) if the each MTJ stack of the selected MRAM cells MC00, ..., MC1n, ... MCm0, ..., MCmn is to be written as having a parallel ferromagnetic free layer and the ferromagnetic pinned layer or an antiparallel parallel ferromagnetic free layer and the ferromagnetic pinned layer. For those MTJ stacks of the selected MRAM cells MC00, ..., MC1n, ..., MCm0, ..., MCmn that have an antiparallel ferromagnetic free layer and the ferromagnetic pinned layer, the write pulse 300 is transferred (Box 402) to the selected source lines 145a, 145b, ..., 145n for programming the MTJ stacks of the selected MRAM cells MC00, ..., MC1n, ... MCm0, ..., MCmn. The first write segment 305a of the write signal 300 is maintained (Box 404) at the first write voltage level $V_{W1}$ for a first write period $\tau_{PW1}$. At the time $\tau_2$, the first write segment 305a of the write signal 300 ends. The second write segment 305b of the write pulse 300 is transferred (Box 406) to the selected source lines 145a, 145b, ..., 145n. The second write segment 305b begins with the voltage level of the second segment 305b falling from first write voltage level $V_{W1}$ to the second write voltage level $V_{W2}$. The second write voltage level $V_{W2}$ is maintained (Box 408) for a second write period $\tau_{PW2}$. At the time $\tau_3$, the write signal falls to the reference voltage level $V_{REF}$ to end the write (Box 418) of the selected MRAM cell MC00, ..., MC1n, ... MCm0, ..., MCmn.

For those MTJ stacks of the selected MRAM cells MC00, ..., MC1n, ..., MCm0, ..., MCmn that have a parallel ferromagnetic free layer and the ferromagnetic pinned layer, the write pulse 300 is transferred (Box 410) to the selected bit line 135a, 135b, ..., 135n for programming the MTJ stacks of the selected MRAM cells MC00, ..., MC1n, ... MCm0, ..., MCmn. The first write segment 305a of the write signal 300 is maintained (Box 412) at the first write voltage level $V_{W1}$ for a first write period $\tau_{PW1}$. At the time $\tau_2$, the first write segment 305a of the write signal 300 ends. The second write segment 305b of the write pulse 300 is transferred (Box 414) to the selected bit lines 135a, 135b, ..., 135n. The second write segment 305b begins with the voltage level of the second segment 305b falling from first write voltage level $V_{W1}$ to the second write voltage level $V_{W2}$. The second write voltage level $V_{W2}$ is maintained (Box 416) for a second write period $\tau_{PW2}$. At the time $\tau_3$, the write signal falls to the reference voltage level $V_{REF}$ to end the write (Box 418) of the selected MRAM cell MC00, ..., MC1n, ..., MCm0, ..., MCmn.

Figure 7B:
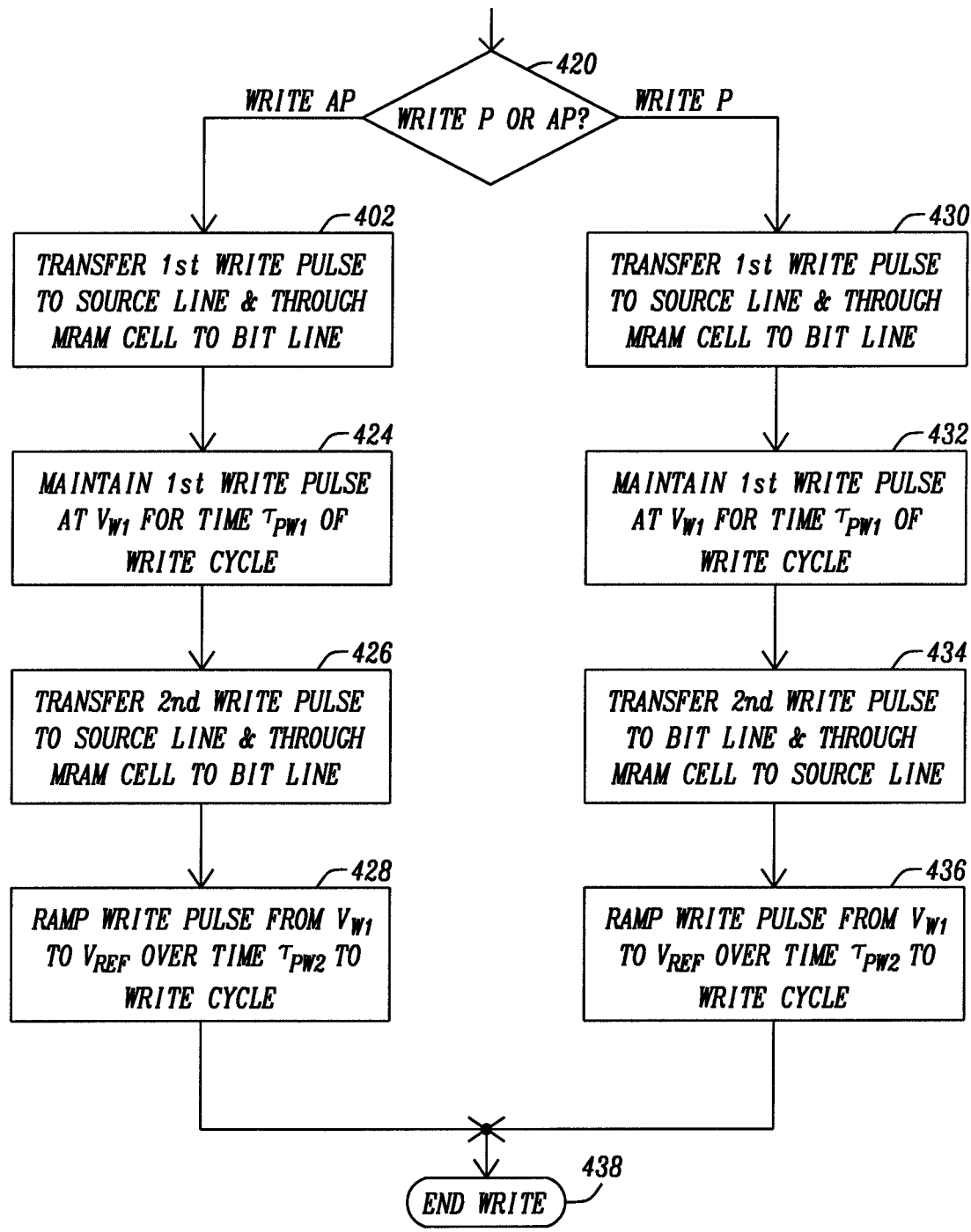

Refer now to FIGS. 3, 6a, and 7b. The bit line decoder 210 and the source line decoder 215 receive the write command and determine (Box 420) if the each MTJ stack of the selected MRAM cells MC00, . . . , MC1n, . . . MCm0, . . . , MCmn is to be written as having a parallel ferromagnetic free layer and the ferromagnetic pinned layer or an antiparallel parallel ferromagnetic free layer and the ferromagnetic pinned layer. For those MTJ stacks of the selected MRAM cells MC00, . . . , MC1n, . . . MCm0, . . . , MCmn that have an antiparallel ferromagnetic free layer and the ferromagnetic pinned layer, the write pulse 325 is transferred (Box 422) to the selected source lines 145a, 145b, . . . , 145n for programming the MTJ stacks of the selected MRAM cells MC00, . . . , MC1n, . . . MCm0, . . . , MCmn. The first write segment 330a of the write signal 325 is maintained (Box 424) at the first write voltage level $V_{W1}$ for a first write period $\tau_{PW1}$. At the time $\tau_2$, the first write segment 330a of the write signal 325 ends. The second write segment 330b of the write pulse 325 is transferred (Box 426) to the selected source lines 145a, 145b, . . . , 145n. The second write segment 330b begins with the first write voltage level $V_{W1}$ and ramps (Box 428) downward to the reference voltage level $V_{REF}$ during the second write period $\tau_{PW2}$. At the time $\tau_3$, the second write segment 330b has fallen to the reference voltage level $V_{REF}$ to end the write (Box 438) of the selected MRAM cell MC00, . . . , MC1n, . . . MCm0, . . . , MCmn.

For those MTJ stacks of the selected MRAM cells MC00, . . . , MC1n, . . . , MCm0, . . . , MCmn that have a parallel ferromagnetic free layer and the ferromagnetic pinned layer, the write pulse 325 is transferred (Box 430) to the selected bit lines 135a, 135b, . . . , 135n for programming the MTJ stacks of the selected MRAM cells MC00, . . . , MC1n, . . . MCm0, . . . , MCmn. The first write segment 330a of the write signal 325 is maintained (Box 432) at the first write voltage level $V_{W1}$ for a first write period $\tau_{PW1}$. At the time $\tau_2$, the first write segment 330a of the write signal 325 ends. The second write segment 330b of the write pulse 325 is transferred (Box 434) to the selected bit lines 135a, 143b, . . . , 135n. The second write segment 330b begins with the first write voltage level $V_{W1}$ and ramps (Box 436) downward to the reference voltage level $V_{REF}$ during the second write period $\tau_{PW2}$. At the time $\tau_3$, the second write segment 330b has fallen to the reference voltage level $V_{REF}$ to end the write (Box 438) of the selected MRAM cell MC00, . . . , MC1n, . . . MCm0, . . . , MCmn.

Figure 7C:
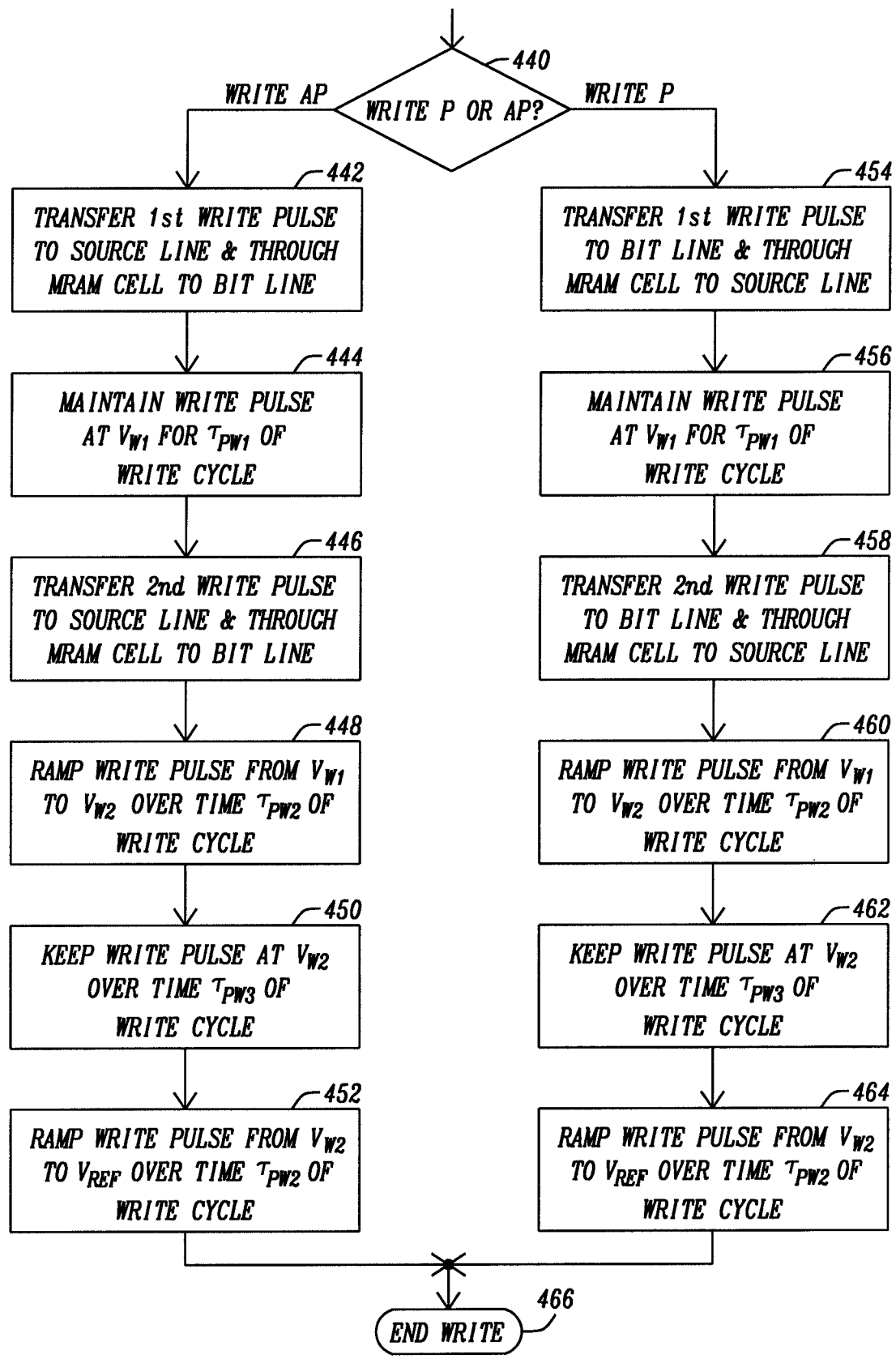

Refer now to FIGS. 3, 6b, and 7c. The bit line decoder 210 and the source line decoder 215 receive the write command and determine (Box 440) if the each MTJ stack of the selected MRAM cells MC00, . . . , MC1n, . . . MCm0, . . . , MCmn is to be written as having an antiparallel ferromagnetic free layer and the ferromagnetic pinned layer or an antiparallel parallel ferromagnetic free layer and the ferromagnetic pinned layer. For those MTJ stacks of the selected MRAM cells MC00, . . . , MC1n, . . . MCm0, . . . , MCmn that have a parallel ferromagnetic free layer and the ferromagnetic pinned layer, the write pulse 335 is transferred (Box 442) to the selected source lines 145a, 145b, . . . , 145n for programming the MTJ stacks of the selected MRAM cells MC00, . . . , MC1n, . . . MCm0, . . . , MCmn. The first write segment 340a of the write signal 335 is maintained (Box 444) at the first write voltage level $V_{W1}$ for a first write period $\tau_{PW1}$. At the time $\tau_2$, the first write segment 340a of the write signal 335 ends. The second write segment 340b of the write pulse 335 is transferred (Box 446) to the selected source lines 145a, 145b, . . . , 145n. The second write segment 340b begins with the first write voltage level $V_{W1}$ and ramps (Box 448) downward to the second write voltage level $V_{W2}$ during the first portion $\tau_{PW2}$ the second write period. At the time $\tau_3$, the second write segment 340b of the write signal 335 is maintained (Box 450) at the second write voltage level $V_{W2}$ for a second portion $\tau_{PW}$. of the second write period. At the time $\tau_4$, the second write segment 340b begins with the second write voltage level $V_{W2}$ and ramps (Box 452) downward to the reference voltage level $V_{REF}$ during the third portion $\tau_{PW4}$. of the second write period. At the time $\tau_5$, the second write segment 340b has fallen to the reference voltage level $V_{REF}$ to end the write (Box 466) of the selected MRAM cell MC00, . . . , MC1n, . . . MCm0, . . . , MCmn.

For those MTJ stacks of the selected MRAM cells MC00, . . . , MC1n, . . . MCm0, . . . , MCmn that have a parallel ferromagnetic free layer and the ferromagnetic pinned layer, the write pulse 335 is transferred (Box 454) to the selected bit lines 135a, 135b, . . . , 135n for programming the MTJ stacks of the selected MRAM cells MC00, . . . , MC1n, . . . MCm0, . . . , MCmn. The first write segment 340a of the write signal 335 is maintained (Box 456) at the first write voltage level $V_{W1}$ for a first write period $\tau_{PW1}$. At the time $\tau_2$, the first write segment 340a of the write signal 335 ends. The second write segment 340b of the write pulse 335 is transferred (Box 458) to the selected bit lines 135a, 13b, . . . , 135n. The second write segment 340b begins with the first write voltage level $V_{W1}$ and ramps (Box 460) downward to the second write voltage level $V_{W2}$ during the first portion $\tau_{PW2}$ the second write period. At the time $\tau_3$, the second write segment 340b of the write signal 335 is maintained (Box 462) at the second write voltage level $V_{W2}$ for a second portion $\tau_{PW2}$ of the second write period. At the time $\tau_4$, the second write segment 340b begins with the second write voltage level $V_{W2}$ and ramps (Box 464) downward to the reference voltage level $V_{REF}$ during the third portion $\tau_{PW4}$. of the second write period. At the time $\tau_5$, the second write segment 340b has fallen to the reference voltage level $V_{REF}$ to end the write (Box 466) of the selected MRAM cell MC00, . . . , MC1n, . . . MCm0, . . . , MCmn.

Figure 7D:
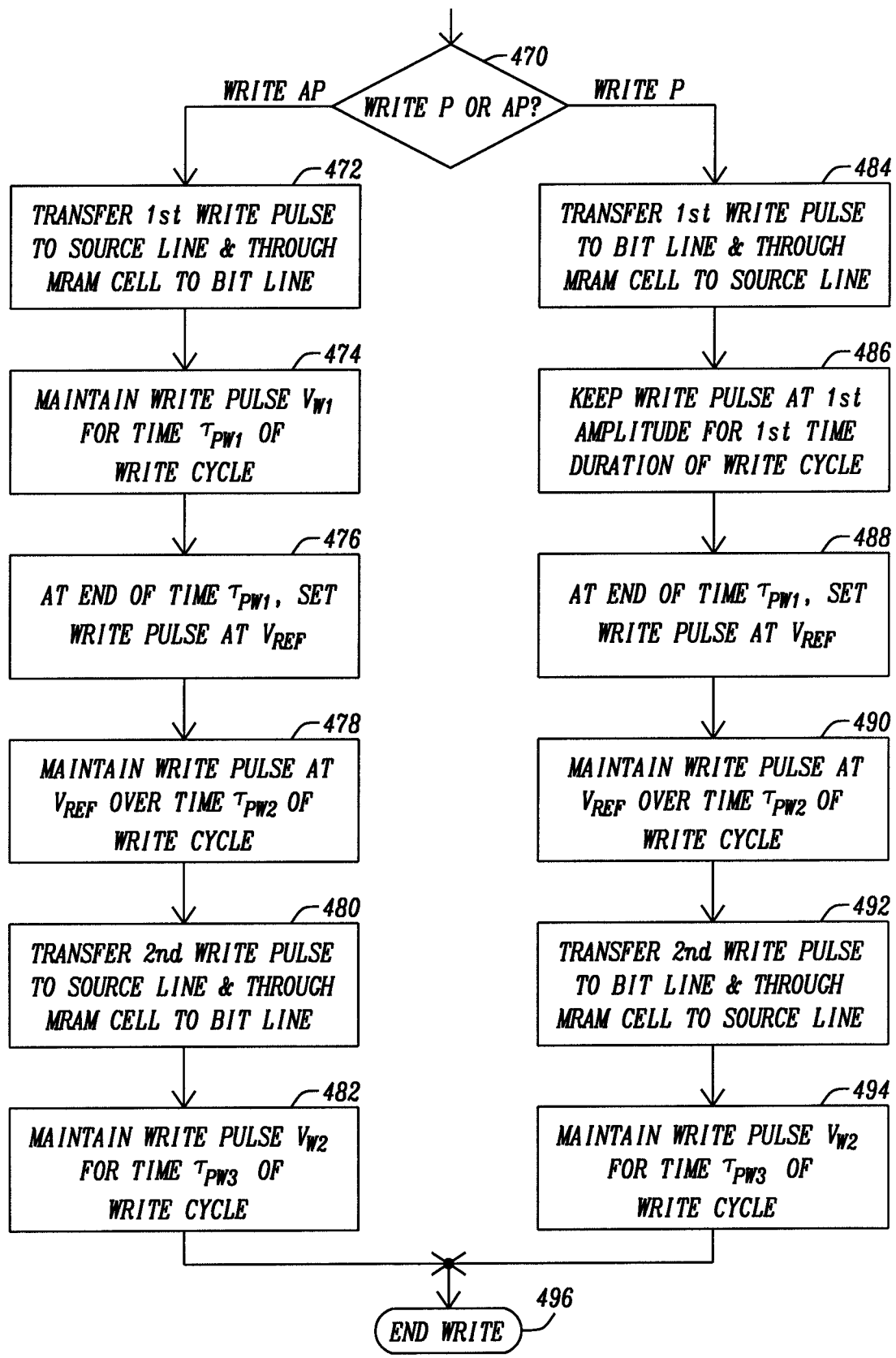

Refer now to FIGS. 3, 6c, and 7d. The bit line decoder 210 and the source line decoder 215 receive the write command and determine (Box 470) if the each MTJ stack of the selected MRAM cells MC00, . . . , MC1n, . . . MCm0, . . . , MCmn is to be written as having an antiparallel ferromagnetic free layer and the ferromagnetic pinned layer or an antiparallel parallel ferromagnetic free layer and the ferromagnetic pinned layer. For those MTJ stacks of the selected MRAM cells MC00, . . . , MC1n, . . . MCm0, MCmn that have a parallel ferromagnetic free layer and the ferromagnetic pinned layer, the write pulse 345 is transferred (Box 472) to the selected source lines 145a, 145b, . . . , 145n for programming the MTJ stacks of the selected MRAM cells MC00, . . . , MC1n, . . . MCm0, . . . , MCmn. The first write segment 350a of the write signal 345 is maintained (Box 474) at the first write voltage level $V_{W1}$ for a first write period $\tau_{PW1}$. At the time $\tau_2$, the first write segment 350a of the write signal 345 ends and the write signal 345 is set (Box 476) to the reference voltage level $V_{REF}$ and maintained (Box 478) at the reference voltage level $V_{REF}$ over the quiescent period $\tau_{PW2}$. At the time $\tau_3$, the second write segment 350b of the write pulse 345 is transferred (Box 480) to the selected source lines 145a, 145b, . . . , 145n. The second write segment 350b begins with the reference voltage level $V_{REF}$ and rises to the second write voltage level $V_{W2}$. The second write voltage level $V_{W2}$ is maintained (Box 482) for a second write period $\tau_{PW3}$. At the time $\tau_4$, the write signal 345 falls to the reference voltage level $V_{REF}$ to end the write (Box 496) of the selected MRAM cell MC00, . . . , MC1n, . . . MCm0, . . . , MCmn.

For those MTJ stacks of the selected MRAM cells MC00, . . . , MC1n, . . . MCm0, . . . , MCmn that have a parallel ferromagnetic free layer and the ferromagnetic pinned layer, the write pulse 345 is transferred (Box 484) to the selected bit lines 135a, 135b, . . . , 135n for programming the MTJ stacks of the selected MRAM cells MC00, . . . , MC1n, . . . MCm0, . . . , MCmn. The first write segment 350a of the write signal 345 is maintained (Box 486) at the first write voltage level $V_{W1}$ for a first write period $\tau_{PW1}$. At the time $\tau_2$, the first write segment 350a of the write signal 345 ends and the write signal 345 is set (Box 488) to the reference voltage level $V_{REF}$ and maintained (Box 490) at the reference voltage level $V_{REF}$ over the quiescent period $\tau_{PW2}$. At the time $\tau_3$, the second write segment 350b of the write pulse 345 is transferred (Box 480) to the selected bit lines 135a, 135b, . . . , 135n. The second write segment 350b begins with the reference voltage level $V_{REF}$ and rises to the second write voltage level $V_{W2}$. The second write voltage level $V_{W2}$ is maintained (Box 494) for a second write period $\tau_{PW3}$. At the time $\tau_4$, the write signal 345 falls to the reference voltage level $V_{REF}$ to end the write (Box 496) of the selected MRAM cell MC00, . . . , MC1n, . . . MCm0, . . . , MCmn.

While this disclosure has been particularly shown and described with reference to the preferred embodiments thereof, it will be understood by those skilled in the art that various changes in form and details may be made without departing from the spirit and scope of the disclosure.

What is claimed is:

1. A method for programming a magnetic tunnel junction stack of a magnetic random access memory (MRAM) cell that minimizes the probability of a ferromagnetic free layer or a ferromagnetic pinned layer experiencing back-hopping to a wrong polarization reversal comprising the steps of:
   activating the MRAM cell by turning on a gating transistor of the MRAM cell;
   applying a first segment of a write pulse at a first write voltage level for a first time period to program the magnetic tunnel junction stack;
   applying a reference voltage level for a quiescent time period beginning at the end of the first time period and ending at the beginning of a second time period, wherein the reference voltage is less than the first write voltage level and less than a second write voltage level that is less than the first write voltage level; and
   applying a second segment of the write pulse at the second write voltage level for the second time period to correct the polarization of the magnetic tunnel junction stack when the magnetic tunnel junction stack has back-hopped to reverse to the wrong polarization during the first time period;
   wherein when the MTJ stack is programmed such that a polarization of the ferromagnetic free layer and a polarization of the ferromagnetic pinned layer are anti-parallel, the polarity of the first segment of the write pulse and the second segment of the write pulse is such that the current flowing through the MTJ stack is antiparallel to the polarization of the ferromagnetic pinned layer.

2. The method for programming the magnetic tunnel junction stack of the magnetic random access memory (MRAM) cell of claim 1 wherein when the MTJ stack is programmed such that a polarization of the ferromagnetic free layer and a polarization of the ferromagnetic pinned layer are parallel, the polarity of the first segment of the write pulse and the second segment of the write pulse is such that the current flowing through the MTJ stack is parallel to the polarization of the ferromagnetic pinned layer.

3. The method for programming the magnetic tunnel junction stack of the magnetic random access memory (MRAM) cell of claim 1, wherein the quiescent time period is less than the first time period.

4. The method for programming the magnetic tunnel junction stack of the magnetic random access memory (MRAM) cell of claim 3, wherein the quiescent time period is greater than the second time period.

5. The method for programming the magnetic tunnel junction stack of the magnetic random access memory (MRAM) cell of claim 1, wherein the first time period is greater than the second time period.

6. The method for programming the magnetic tunnel junction stack of the magnetic random access memory (MRAM) cell of claim 1, wherein the MRAM cell includes a magnetic tunnel junction stack having:
   the ferromagnetic free layer,
   a tunnel barrier layer disposed over the ferromagnetic free layer, and
   the ferromagnetic pinned layer disposed over the tunnel barrier layer.

7. The method for programming the magnetic tunnel junction stack of the magnetic random access memory (MRAM) cell of claim 1, further comprising applying the reference voltage level for a third time period beginning at the end of the second time period.

8. A control circuit configured for developing the timing and control signals that are applied to an array of MRAM cells, the control circuit comprises:
   a word line decoder connected to a plurality of word lines, wherein each word line is connected to a gate of each gating transistor of a row of MRAM cells associated with one word line;
   a bit line decoder connected to a plurality of bit lines, wherein each bit line is connected to a second electrode of an MTJ stack of each of the MRAM cells of a column of MRAM cells associated with one bit line;
   a source line decoder connected to a plurality of source lines, wherein each source line is connected to a source of a gating transistor of each of the MRAM cells of a column of MRAM cells associated with one source line; and
   a write pulse generator connected to the word line decoder for providing a word line select signal for transfer to a selected row of the MRAM cells for turning on a gating transistor of each of the MRAM cells of the selected row of MRAM cells, connected to the bit line decoder and the source line decoder for transferring a first segment of the write pulse at a first write voltage level for a first time period to program the magnetic tunnel junction stacks of the selected row of MRAM cells, for transferring a reference voltage level that is applied for a quiescent time period starting at the end of the first time period and ending at a beginning of a second time period, wherein the reference voltage is less than the first write voltage level and less than a second write voltage level that is less than the first write voltage level, and for transferring a second segment of the write pulse at the second write voltage level for the second time period to correct the polarization of magnetic tunnel junction stacks of the selected row of MRAM cells when the magnetic tunnel junction stacks have back-hopped to reverse to the wrong polarization during the first time period, wherein the write pulse generator generates the first and second segments of the write pulse, which are applied through the bit line decoder to the selected MRAM cells, and generates a reference voltage level, which is applied through the source line decoder to the selected MRAM cells, when the MTJ stacks of the selected MRAM cells are programmed such that a polarization of the ferromagnetic free layer and a polarization of the ferromagnetic pinned layer are antiparallel.

9. The control circuit of claim 8 wherein the write pulse generator generates first and second segments of the write pulse to be applied through the source line decoder to the selected MRAM cells and the bit line decoder applies a reference voltage level to the selected MRAM cells, when the MTJ stacks are programmed such that a polarization of the ferromagnetic free layer and a polarization of the ferromagnetic pinned layer are parallel.

10. The control circuit of claim 8 wherein the quiescent time period is a different amount of time than both the first time period and the second time period.

11. The control circuit of claim 8, wherein the second time period is less than the first time period.

12. An integrated circuit formed on a substrate comprising:
an MRAM memory array comprising a plurality of MRAM cells arranged in rows and columns, each MRAM cell comprising:
a magnetic tunnel junction (MTJ) stack comprising:
a ferromagnetic free layer having a magnetization direction representing stored memory information,
a ferromagnetic pinned layer having a magnetization direction that is fixed during chip operation to provide spin transfer torque, and
a tunnel barrier between the ferromagnetic free layer and the ferromagnetic pinned layer for yielding different resistances for parallel and anti-parallel configurations of the magnetization directions of the ferromagnetic free layer and ferromagnetic pinned layer, and
a gating transistor having a drain connected to a first terminal of the MTJ stack;
a word line decoder connected to a plurality of word lines, wherein each word line is connected to a gate of each gating transistor of a row of MRAM cells associated with one word line;
a bit line decoder connected to a plurality of bit lines, wherein each bit line is connected to a second electrode of an MTJ stack of each of the MRAM cells of a column of MRAM cells associated with one bit line;
a source line decoder connected to a plurality of source lines, wherein each source line is connected to a source of the gating transistor of each of the MRAM cells of a column of MRAM cells associated with one source line; and
a write pulse generator connected to the word line decoder for providing a word line select signal for transfer to a selected row of the MRAM cells for turning on the gating transistor of each of the MRAM cells of the selected row of MRAM cells, connected to the bit line decoder and the source line decoder for transferring a first segment of the write pulse at a first write voltage level for a first time period to program the magnetic tunnel junction stacks of the selected row of MRAM cells, for transferring a reference voltage level that is applied for a quiescent time period starting at the end of the first time period and ending at a beginning of a second time period, wherein the reference voltage is less than the first write voltage level and less than a second write voltage level that is less than the first write voltage level, and for transferring a second segment of the write pulse at the second write voltage level for the second time period to correct the polarization of magnetic tunnel junction stacks of the selected row of MRAM cells when the magnetic tunnel junction stacks have back-hopped to reverse to the wrong polarization during the first time period, wherein the write pulse generator generates the first and second segments of the write pulse, which are applied through the bit line decoder to the selected MRAM cells, and generates a reference voltage level, which is applied through the source line decoder to the selected MRAM cells, when the MTJ stacks of the selected MRAM cells are programmed such that a polarization of the ferromagnetic free layer and a polarization of the ferromagnetic pinned layer are antiparallel.

13. The integrated circuit of claim 12 wherein the write pulse generator generates first and second segments of the write pulse to be applied through the source line decoder to the selected MRAM cells and the bit line decoder applies a reference voltage level to the selected MRAM cells, when the MTJ stacks are programmed such that a polarization of the ferromagnetic free layer and a polarization of the ferromagnetic pinned layer are parallel.

14. The integrated circuit of claim 12, wherein the quiescent time period is a different amount of time than at least one of the first time period and the second time period.

15. The integrated circuit of claim 12, wherein the quiescent time period is a different amount of time than both the first time period and the second time period.

16. The integrated circuit of claim 12, wherein the quiescent time period is less than both the first time period and the second time period.

17. The integrated circuit of claim 12, wherein the second time period is less than the first time period.

* * * * *